United States Patent

Trumble et al.

[11] Patent Number: 5,981,871
[45] Date of Patent: Nov. 9, 1999

[54] ELECTRONICS ENCLOSURES

[75] Inventors: William P. Trumble; Patrick T. Lawless, both of Kanata, Canada

[73] Assignee: Nortle Network Corporation, Montreal, Canada

[21] Appl. No.: 08/995,410

[22] Filed: Dec. 19, 1997

Related U.S. Application Data

[60] Provisional application No. 60/045,315, May 1, 1997.

[51] Int. Cl.[6] ....................................................... H05K 9/00
[52] U.S. Cl. ........................................ 174/35 GC; 174/51
[58] Field of Search .............................. 174/50, 51, 35 R, 174/35 GC, 35 MS; 220/3.2, 3.3

[56] References Cited

U.S. PATENT DOCUMENTS

| | | | |
|---|---|---|---|
| 2,321,727 | 6/1943 | Bardsley | 174/50 |
| 3,724,706 | 4/1973 | Slocum | 174/50 X |
| 5,621,189 | 4/1997 | Dodds | 174/50 |
| 5,658,668 | 8/1997 | Kobayashi et al. | 428/418 |
| 5,749,178 | 5/1998 | Garmong | 174/35 R X |

*Primary Examiner*—Dean A. Reichard
*Attorney, Agent, or Firm*—Angela C. de Wilton; Reginald J. Austin

[57] ABSTRACT

An electronics enclosure includes an assembly of wall elements having metallic surfaces with a standard oxidization potential within the range of −0.25 to +0.5 volts, the wall elements rigidly secured together, and having a coating of molybdenum phosphate covering the metallic surfaces of the wall elements and providing electrical discharge continuity around the enclosure. The molybdenum phosphate coating provides a required degree of electrical conductivity for adequate electrostatic discharge thereby providing a Faraday cage to filter out any electromagnetic radiation attempting to pass through the enclosure. Of particular importance in the structure is the feature that the molybdenum phosphate is particularly effective as an electromagnetic interference element at junctures between wall elements of the enclosure. The molybdenum phosphate coating may be applied to the wall elements either prior to assembly or following assembly. Preferably, the coating is applied to assembled wall elements with the molybdenum phosphate bridging between adjacent wall elements and bridging across gaps between the adjacent wall elements.

7 Claims, 2 Drawing Sheets

FIG. I

ELECTRONICS ENCLOSURES

This application claims the benefit of provisional application No. 60/045,315 filed May 1, 1997.

BACKGROUND OF THE INVENTION

1. Field of the Invention

This invention relates to electronics enclosures.

2. Relevant Prior Art

For many years, in the manufacture of electronics enclosures, e.g. in the manufacture of frame or other equipment or steel shelves for housing printed circuit boards and circuit packs, the walls of the enclosures have been coated with zinc plating which has, in turn, been protected by a chromate conversion coating of varying thickness. The chromate protected zinc coating provided sufficient rust protection to the metal of the enclosures. A problem existed, however, with such enclosures. In order to ground the enclosures, it has always been necessary to employ beryllium copper gaskets between metal components, the gaskets having sharp spurs. When the metal components are secured together, the spurs cut into the metal to be held forcibly against bare metal surfaces thereby providing gas-tight connections for the passage of electrical current between the metal components thereby providing the grounding effect. The protection afforded by the chromate conversion coating over the zinc coating in localized areas is immediately destroyed by the forcing of the metal spurs through the metal surfaces. As a result, to prevent corrosion at those localized regions, it is then necessary to provide a localized protection which has, in the main, taken the form of a tin/lead solder applied to the enclosures. Hence, in forming the conventional enclosures, in order to provide certain electrical requirements, other problems have been created which need solving with further protective measures.

Electronics enclosures manufactured in the above manner have been satisfactory until the advent of electronic equipment which emits electromagnetic radiation thereby resulting in electromagnetic interference (EMI) which is found to effect the function of other electronic equipment. Electronics enclosures of the above general structure and made in the above manner are now being found to be sadly lacking in providing protection either for electronics equipment housed within the enclosures against EMI emanating from outside the enclosures or for equipment disposed outside the enclosures and against EMI originating inside the enclosures.

SUMMARY OF THE INVENTION

The present invention provides according to one aspect an electronics enclosure having EMI protection. According to a further aspect, the present invention provides a method of providing EMI protection for such an enclosure.

According to a first aspect of the present invention, an electronics enclosure comprises an assembly of wall elements having metallic surfaces with a standard oxidation potential within the range of −2.5 to +0.5 volts, the wall elements rigidly secured together, and a coating of molybdenum phosphate covering the metallic surfaces of the wall elements and providing electrical discharge continuity around the enclosure.

It has been found that in enclosures according to the invention as defined above, that adequate EMI protection is afforded by the enclosure. This is because the molybdenum phosphate coating provides a required degree of electrical conductivity for adequate electrostatic discharge and thereby providing a Faraday cage to filter out any electromagnetic radiation attempting to pass through the enclosure. Of particular importance in the structure is the feature that the molybdenum phosphate is particularly effective as an electromagnetic interference element at junctures between the wall elements of the enclosure.

In one arrangement of an enclosure according to the invention, the assembly of wall elements has a coating of molybdenum phosphate covering the assembly so that the molybdenum phosphate bridges between adjacent wall elements and bridges across gaps between adjacent wall elements. Such a structure is manufactured by applying the coating of molybdenum phosphate subsequent to the making of the assembly of the wall elements. As may be seen with this particular arrangement, the molybdenum phosphate lies intimately in engagement with all the metallic surfaces which are exposed to the molybdenum phosphate during the coating process. All of the surfaces of the assembly are thus covered and any gaps between adjacent wall elements through which electromagnetic radiation could pass are successfully bridged and possibly completely blocked by the coating material. In forming the assembly of wall elements, any known method of rigidly securing the wall elements together may be used. For instance, in suitable circumstances, welding or soldering or even brazing may be employed or alternatively the wall elements may be riveted, screwed or bolted together.

In another arrangement of forming an electronics enclosure according to the invention, each of the wall elements is coated with molybdenum phosphate before being rigidly secured to other wall elements in the final assembly. With such an arrangement, the wall elements should preferably be secured together either by riveting or by screw-threaded techniques. This then causes surface-to-surface contact of the molybdenum phosphate coatings between adjacent sheets with the surfaces being pressed together under the forces employed in the assembly procedure. The pressurized surface-to-surface contact of the coatings is sufficient to provide electrical continuity effectively providing a Faraday cage. In the latter arrangement where the coating of molybdenum phosphate is provided upon each wall element before assembly takes place, then it may be impractical to join together the wall elements by the employment of heat, as in welding or soldering, because this may undoubtedly deleteriously effect the molybdenum phosphate coating.

As may be seen, in the manufacture of electronics enclosures according to the invention, the use of beryllium copper gaskets or any other holding means employing spurs which need to cut into the metal, are completely avoided. Hence, problems associated with the need to protect localized bared metal surfaces such as require tin/lead solder plating are avoided.

The invention also provides according to a further aspect, a method of making an electronics enclosure comprising providing wall elements for the enclosure, the wall elements having metallic surfaces with a standard oxidation potential within the range of 2.5 to +0.5 volts, and forming a coating on the wall elements with molybdenum phosphate to provide electrical discharge continuity around the enclosure.

In one preferred manner of performing the method, the wall elements are rigidly secured together as an assembly and the coating is formed over the assembly with the molybdenum phosphate bridging between adjacent wall elements and bridging across gaps between the adjacent wall elements. In another manner of performing the method, each wall element is individually coated with molybdenum phosphate and then the wall elements are rigidly secured together so that the individual coatings of adjacent elements are held in pressurized surface-to-surface contact between the coatings.

BRIEF DESCRIPTION OF DRAWINGS

Embodiments of the invention will now be described, by way of example, with reference to the accompanying drawings, in which.

DESCRIPTION OF PREFERRED EMBODIMENT

Figure 1:
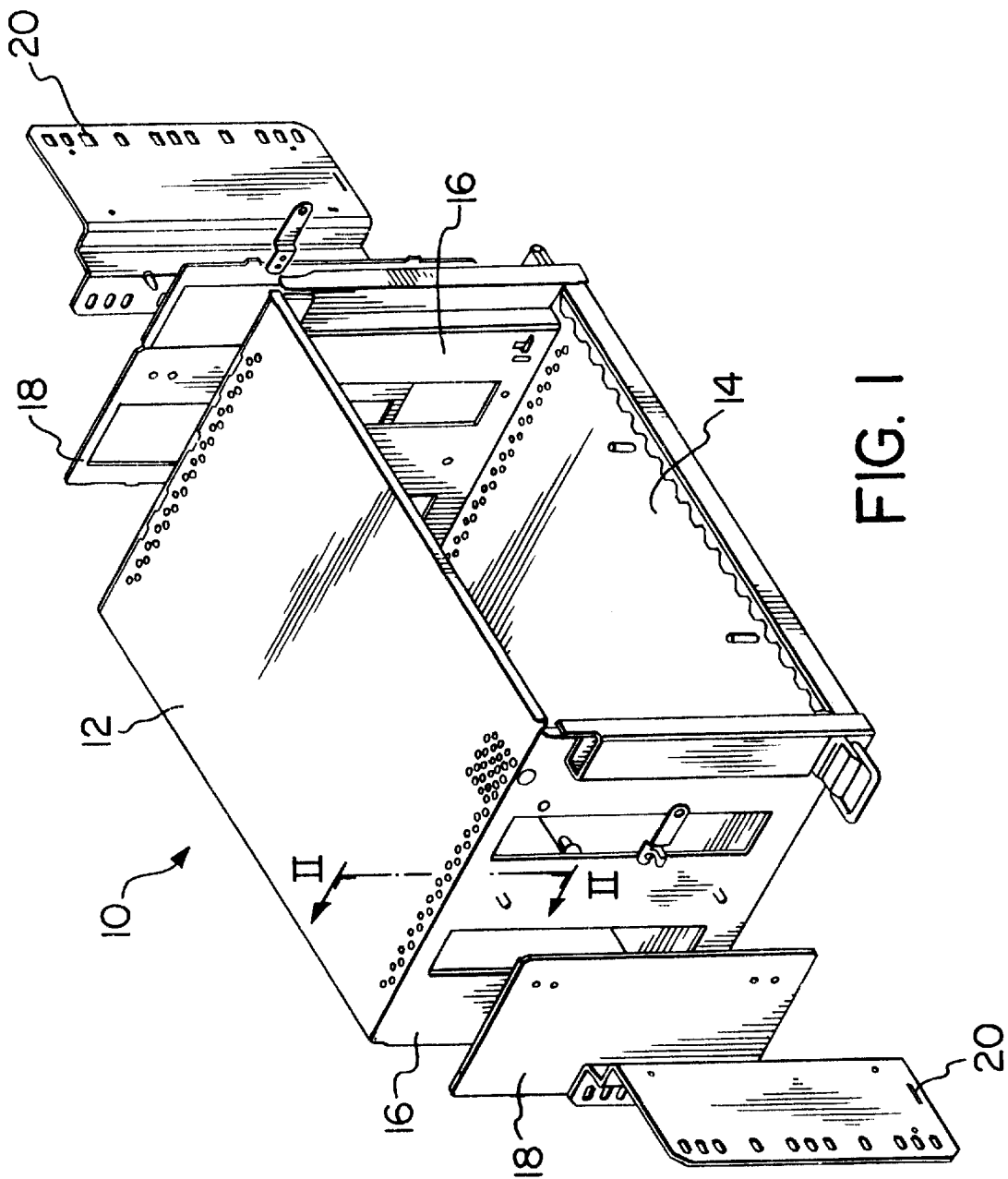
FIG. 1 is an exploded isometric view of an electronics enclosure in the form of a shelf according to the first embodiment and for receiving printed circuit boards.

In a first embodiment as shown by FIG. 1, an electronics enclosure comprises a shelf 10 for slidably receiving printed circuit boards. The shelf comprises upper and lower walls 12 and 14 and side walls 16 extending between the upper and lower walls. Additionally, the shelf 10 has side panels 18 for location upon the side walls 16 and L-shaped side extensions 20 to act as supports for subsidiary equipment.

Figure 2:
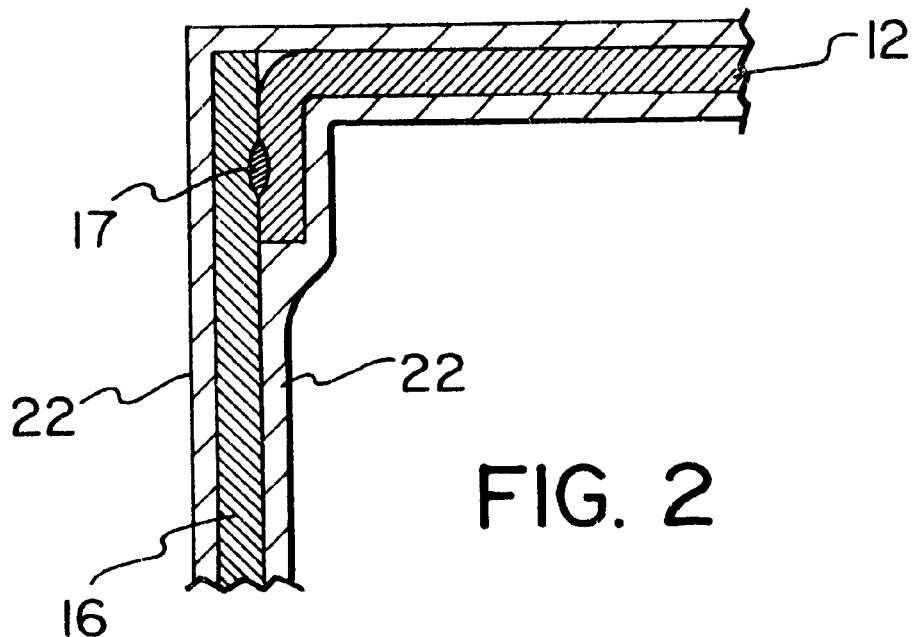
FIG. 2 is a cross-sectional view through a corner of the shelf taken along line II—II in FIG. 1.

Each of the elements, i.e. walls, side panels and extensions of the shelf is formed of a suitable metal for the shelf, the metal having a standard oxidation potential surface within the range of −2.5 to +0.5 volts. In the case of the embodiment, each of the metal components is provided by a mild steel sheet which is zinc plated (plating not shown) to provide corrosion protection. However, the metal components may, alternatively, be of other suitable materials, e.g. aluminum, and zinc plating may or may not be used. The shelf is assembled by any of the known assembly techniques including welding, brazing, soldering, bolting or screwing. Each of the assembly methods does therefore apply to the first embodiment. As an example of this as shown in FIG. 2, the upper wall 12 is assembled to a side wall 16 by spot welding 17 which is applied as in conventional manner at localized spaced positions.

While the spot welding or any other joining method of the metal components is suitable for providing structural strength for the shelf, it has been normal to provide some other means for conducting electrical current from metal member to metal member for grounding effect. However, such methods of grounding are unsuitable in the present instance wherein the shelf is to be used to house printed circuit boards including components which emit electromagnetic radiation which may result in electromagnetically interfering with the function of electronic equipment outside the shelf configuration. The present invention overcomes this problem and as exemplified by this particular embodiment by the use of a coating of molybdenum phosphate upon the assembly of the metal elements forming the structure. As shown by FIG. 2, the completed assembly of the metal elements is dipped or otherwise coated with a coating 22 of the molybdenum phosphate. This coating may be applied over the zinc plating according to a method as described in U.S. Pat. No. 5,607,521 granted Mar. 4, 1997 to G. Bech-Nielsen. As may be seen from FIG. 2 in the finished structure, the coating of the molybdenum phosphate extends in intimate contact with the zinc plating over the whole of the surface of the structure both inside and outside of the shelf. In addition to this, and of extreme importance is that the molybdenum phosphate layer or coating extends across from one sheet metal member to another. This may be seen from FIG. 2 in which the coating of molybdenum phosphate extends across from the upper wall 12 to the side wall 16 both inside and outside of the construction. Hence, there is a single continuous coating 22 of the molybdenum phosphate and no bare surfaces of the zinc plating or of the sheet steel are exposed. In addition, any gaps which are formed or exist between the metal elements are completely filled or bridged by the coating of molybdenum phosphate.

The shelf 10 is required to be used not only inside buildings under controlled temperature conditions but also may need to be used in outside environments with temperature conditions existing anywhere between −25° C. and +30° C. In such conditions it is found that the molybdenum phosphate coating 22 provides a required contact resistance between the zinc plated mild steel surfaces and, in conjunction with the surface conductivity, it has been discovered that the coating provides an adequate electrostatic discharge and electromagnetic interference protection at the juncture of the metal surfaces of the shelf to act as an efficient Faraday cage. Hence, not only does the shelf effectively operate as a grounded component, but also the coating 22 provides a satisfactory electromagnetic shield and ensures that any gaps through which electromagnetic radiation would otherwise pass are completely blocked and shielded.

In addition, the molybdenum phosphate is stable up to temperatures of 90° C. and provides corrosion protection up to these temperatures. In addition, there is conductivity of the coating between the inner and outer surfaces, the inner surface being that in interfacial contact with the metal such that adjacent metal elements of the shelf are effectively in electrical contact for grounding conditions.

Further advantages stem from the fact that the use of molybdenum phosphate as a coating material enables the use of any desired color to be incorporated into an enclosure such as the shelf of the embodiment as color enhancement may be provided in the coating material itself before application to the enclosure. However, if required, it is also possible to provide an outer paint coating over the molybdenum phosphate coating as it is found that the surface of the phosphate is completely amenable to the acceptance of paint. One further important consideration is, of course, that while all of the advantages are provided by the use of molybdenum phosphate as compared to conventional chromate coatings, the application of the molybdenum phosphate may be achieved while avoiding the development of toxic or hazardous substances.

Figure 3:
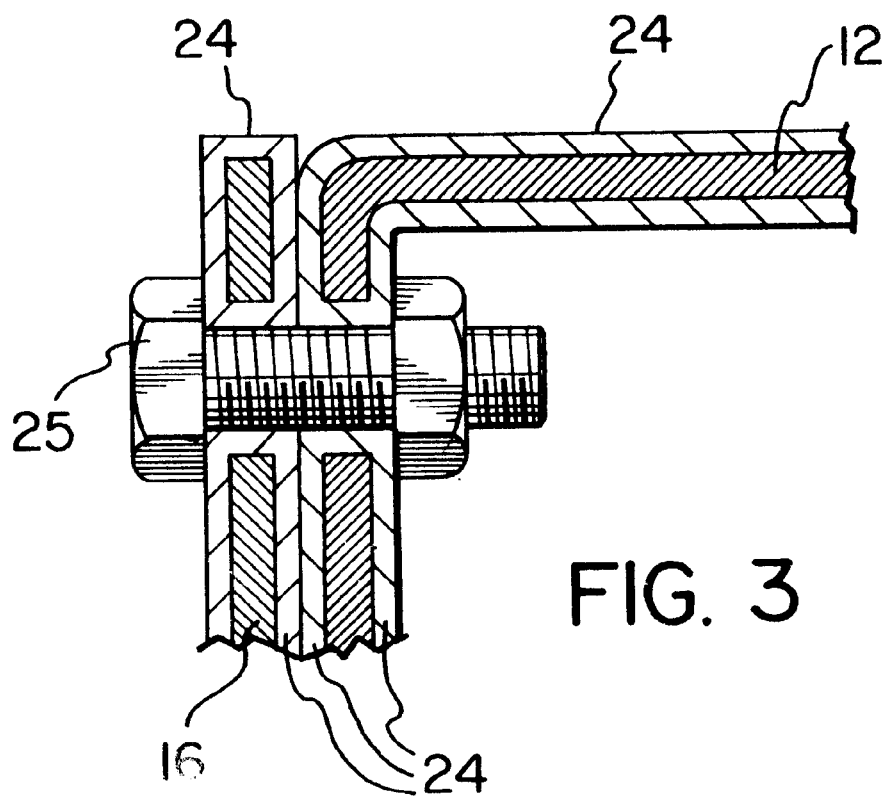
FIG. 3 is a view similar to FIG. 2 of part of an electronics enclosure according to a second embodiment.

It is not necessary according to the invention to first assemble the enclosure and then coat it entirely with the molybdenum phosphate. This is illustrated by the second embodiment in FIG. 3 in which a shelf similar to FIG. 1 has separate metal elements such as the upper wall 12 and side walls 16 which are individually coated with coatings 24 of molybdenum phosphate before the elements are assembled together. As may be seen from FIG. 3, the pre-coated metal elements each have pre-drilled holes for acceptance of screws or bolts 25 or even rivets and the holes themselves are coated with the molybdenum phosphate. When assembled together, for instance, by nuts and bolts as shown in FIG. 3, the coatings of the molybdenum phosphate of adjacent metal elements are forced into contact so that the surfaces of the coatings are pressurized together. This pressurization causes the contacting surfaces to conform substantially in shape to each other thereby either completely closing any gaps between the confronting surfaces or ensuring that any gaps which still exist are minimal in size and are insufficient for passage of electromagnetic radiation.

An enclosure manufactured from pre-coated metal elements as shown in the second embodiment has the same advantages as that discussed with regard to the first embodiment.

What is claimed is:

1. An electromagnetics enclosure comprising an assembly of wall elements and having metallic surfaces with a standard oxidization potential within the range of −2.5 to +0.5 volts, the wall elements rigidly secured together, and an electrically conductive coating of molybdenum phosphate covering the metallic surfaces of the wall elements and providing electrical discharge continuity around the enclosure.

2. An enclosure according to claim 1 wherein each wall element has an individual coating of molybdenum phosphate and the wall elements are rigidly secured together with the individual coatings of adjacent wall elements held with pressurized surface-to-surface contact between the coatings.

3. An enclosure according to claim 1 wherein the electrically conductive coating of molybdenum phosphate covers the assembly with the molybdenum phosphate bridging junctures between adjacent wall elements and bridging across gaps between adjacent wall elements.

4. A method of making an electronics enclosure comprising providing wall elements for the enclosure, the wall elements having metallic surfaces with a standard oxidation potential within the range of −2.5 to +0.5 volts and forming an electrically conductive coating of molybdenum phosphate on the wall elements to provide electrical discharge continuity around the enclosure.

5. A method according to claim 4 comprising rigidly securing together the wall elements as an assembly and then coating the assembly of wall elements with the coating of molybdenum phosphate, the molybdenum phosphate bridging junctures between adjacent wall elements and bridging across gaps between adjacent wall elements.

6. A method according to claim 4 comprising individually coating each wall element with molybdenum phosphate and then assembling the wall elements together to form an assembly with the coatings of molybdenum phosphate of adjacent wall elements lying in pressurized surface-to-surface contact to provide electrical discharge continuity around the enclosure.

7. A method of making an electronics enclosure comprising:

providing wall elements for the enclosure, the wall elements having metallic surfaces with a standard oxidation potential within the range of −2.5 to +0.5 volts, rigidly securing together the wall elements as an assembly, and then, coating the assembly of wall elements with a coating of molybdenum phosphate to provide electrical discharge continuity around the enclosure, the molybdenum phosphate bridging junctures between adjacent wall elements and bridging across gaps between adjacent wall elements.

* * * * *